United States Patent [19]
Kimura et al.

[11] Patent Number: 5,843,227
[45] Date of Patent: Dec. 1, 1998

[54] CRYSTAL GROWTH METHOD FOR GALLIUM NITRIDE FILMS

[75] Inventors: Akitaka Kimura; Haruo Sunakawa; Masaaki Nido; Atsushi Yamaguchi, all of Tokyo, Japan

[73] Assignee: NEC Corporation, Tokyo, Japan

[21] Appl. No.: 782,075

[22] Filed: Jan. 13, 1997

[30] Foreign Application Priority Data

Jan. 12, 1996 [JP] Japan ................................ 8-020623

[51] Int. Cl.$^6$ ................................ C30B 25/18
[52] U.S. Cl. ...................... 117/101; 117/94; 117/101; 117/104; 117/952
[58] Field of Search ............. 117/952, 94, 101, 117/104

[56] References Cited

U.S. PATENT DOCUMENTS

| | | | |
|---|---|---|---|
| 4,939,557 | 7/1990 | Pao et al. | 357/22 |
| 5,376,580 | 12/1994 | Kish et al. | 437/127 |
| 5,385,862 | 1/1995 | Meustakas | 117/952 |
| 5,502,316 | 3/1996 | Kish et al. | 257/94 |

OTHER PUBLICATIONS

Hooper et al "Same Aspects of GaN Growth in (100) GaAs Substrates using molecular beam epitaxy . . . " Journal of Crystal Growth vol. 155(3/4) pp. 157–163 1995.

Tsuchiya et al., "Metelorganic molecular beam epitaxy of cubic GaN on (100) GaAs substrates . . . " Journal of Crystal Growth vol. 152(1/2) pp. 21–27 1995.

S. Nakamura, "InGaN/ALGaN blue–emitting diodes", *J. Vac. Sci. Technol.*, vol. A 13, No. 3, May/Jun. 1995, pp. 705–710.

Guo et al., "Growth of InN films on GaAs (111) . . . microwave–excited metalorganic vapor phase epitaxy", *Appl. Phys. Lett.*, vol. 66, No. 6, Feb. 6, 1995, pp. 715–717.

Lacklison et al., "Band gap pf GaN films grown by molecular–beam epitaxy on GaAs and GaP substrates", *J. Appl. Phys.*, vol. 78, No. 3, Aug. 1, 1995, pp. 1838–1842.

*Primary Examiner*—Robert Kunemund
*Attorney, Agent, or Firm*—Sughrue, Mion, Zinn, Macpeak & Seas, PLLC

[57] ABSTRACT

A crystal growth method for growing on a gallium arsenide (GaAs) substrate a gallium nitride (GaN) film which is good in surface flatness and superior in crystallinity. According to the method, a GaAs substrate having a surface which is inclined with respect to the GaAs(100) face is used. The inclination angle of the substrate surface is larger than 0 degree but smaller than 35 degrees with respect to the GaAs(100) face. The inclination direction of the substrate surface is within a range of an angular range from the [0,0,1] direction of GaAs to the [0,−1,0] direction past the [0,−1,1] direction and angles less than 5 degrees on opposite sides of the angular range around an [1,0,0] direction of gallium arsenide taken as an axis, or within another range crystallographically equivalent to the range. The GaN layer is formed on the surface of the GaAs substrate preferably by hydride vapor deposition method.

9 Claims, 6 Drawing Sheets

CRYSTAL GROWTH METHOD FOR GALLIUM NITRIDE FILMS

BACKGROUND OF THE INVENTION

1. Field of the Invention

This invention relates to a crystal growth method for growing a gallium nitride (GaN) film on a gallium arsenide (GaAs) crystalline substrate, and more particularly to a crystal growth method by which a GaN film which has a flat surface and is superior in crystallinity can be formed.

2. Description of the Prior Art

Since GaN has a comparatively large band gap, application of it to light emitting devices such as light emitting diodes (LEDs) and laser diodes (LDs) which operate in a wavelength region from blue light to ultraviolet (UV) light is anticipated. A GaN film is usually formed on a suitable single crystalline substrate by crystal growth.

Up to now, a sapphire substrate is used most popularly as a substrate when a crystalline GaN layer is formed by crystal growth. An LED constructed such that a GaN layer is provided on a sapphire substrate is reported, for example, in S. Nakamura, J. Vac. Sci. Technol. A, Vol. 13, No. 3, p.705, May/June 1995. FIG. 1 is a schematic sectional view showing an LED having such a construction as described above. The light emitting diode includes a sapphire substrate 501 whose (0001) face is used as the surface thereof. The LED further includes, successively layered on the sapphire substrate 501, a GaN low temperature buffer layer 502 of 30 nm thick formed at 510° C., an n-type GaN layer 503 of 4 μm thick formed at 1,020° C. and having silicon (Si) doped therein, an n-type $Al_{0.15}Ga_{0.85}N$ layer 504 of 0.15 μm thick formed at 1,020° C. and having silicon doped therein, an $In_{0.06}Ga_{0.94}N$ layer 505 of 100 nm thick formed at 800° C. and having zinc (Zn) and silicon doped therein, a p-type $Al_{0.15}Ga_{0.85}N$ layer 506 of 0.15 μm thick formed at 1,020° C. and having magnesium (Mg) doped therein, and a p-type GaN layer 507 of 0.5 μm thick formed at 1,020° C. and having magnesium doped therein. A p-electrode 508 formed from two layers of nickel (Ni) and gold (Au) is provided on the p-type GaN layer 507, and an n-electrode 509 formed from two layers of titanium (Ti) and aluminum (Al) is provided on the n-type GaN layer 503.

A GaN film formed by crystal growth on a sapphire substrate is advantageous comparing with another GaN film formed on any other substrate in that it is good in flatness of the surface and is superior in crystallinity. However, crystal growth of a GaN film on a sapphire substrate has a problem arising from the fact that the sapphire substrate has no electric conductivity and does not allow cleavage, and has another problem in that process techniques which have been developed with other compound semiconductors on GaAs substrates or indium phosphide (InP) substrates in the past cannot be utilized. Since a sapphire substrate is used, with the LED shown in FIG. 1, both the p-electrode and the n-electrode must be formed on the device surface, which makes the electrode formation process complicated.

On the other hand, use of GaAs as a substrate for crystal growth of a GaN film is advantageous in that it has conductivity and allows cleavage and also in that process techniques which have been developed with various compound semiconductors on GaAs substrates in the past can be utilized. Crystal growth of a GaN layer on a GaAs(111) substrate is disclosed, for example, in Qixin Guo et al., Appl. Phys. Lett., 66, 715(1995). Crystal growth of a GaN layer on a GaAs(100) substrate is disclosed, for example, in D. E. Lacklison et al., J. Appl. Phys., 78, 1838(1995). However, a conventional GaN layer formed on a GaAs substrate is disadvantageous comparing with another GaN layer formed on a sapphire substrate in that it is inferior in flatness of the surface and is low in crystallinity.

FIG. 2 is a scanning electron microscope (SEM) photograph showing a cross section and the surface of a film formed by a hydride vapor deposition method on a GaAs substrate whose (100) face is used as the surface. A GaAs substrate 301 shown in FIG. 2 is doped with chromium oxide (CrO) in a concentration of 0.33 weight ppm. A GaN low temperature growth buffer layer 302 and a GaN high temperature growth layer 303 are successively formed on the GaAs(100) substrate 301 by crystal growth. Both the GaN low temperature growth buffer layer 302 and the GaN high temperature growth layer 303 are undoped. The growth conditions are such as follows. First, the GaN low temperature growth buffer layer 302 is formed for 30 minutes at a substrate temperature of 485° C., and then the substrate temperature is raised to 700° C. and the GaN high temperature growth layer 303 is formed for 30 minutes. As seen from FIG. 2, the flatness of the surface of the GaN high temperature growth layer 303 is very bad.

FIG. 3 is a SEM photograph showing a cross section and the surface of a GaN film formed by a hydride vapor deposition method on a GaAs(111)B substrate using a conventional method. A GaAs substrate 311 shown in FIG. 3 is doped with CrO in a concentration of 0.33 weight ppm. A GaN low temperature growth buffer layer 302 and a GaN high temperature growth layer 303 are successively formed on the GaAs(111)B substrate 311 by crystal growth. Both the GaN low temperature growth buffer layer 302 and the GaN high temperature growth layer 303 are undoped, and the growth conditions are same as those of the GaN film shown in FIG. 2. While the GaN film shown in FIG. 3 is superior in surface flatness to that shown in FIG. 2, it is disadvantageous in crystallinity in that the GaN high temperature growth layer 303 suffers from columnar growth.

After all, crystal growth of a GaN film on a crystalline GaAs substrate using a conventional technique suffers from the problems that it is low in crystallinity and that it is low in surface flatness.

SUMMARY OF THE INVENTION

It is an object of the present invention to provide a crystal growth method by which a crystalline gallium nitride (GaN) film which is good in surface flatness and superior in crystallinity can be formed on a gallium arsenide (GaAs) substrate.

According to the present invention, in a crystal growth method for forming a GaN film on a GaAs substrate, the GaAs substrate has a surface which is inclined with respect to the GaAs(100) face, the inclination angle of the surface is larger than 0 degree but smaller than 35 degrees with respect to the GaAs(100) face, and the inclination direction of the surface is within a range of an angular range from the [0,0,1] direction of GaAs to the [0,−1,0] direction past the [0,−1,1] direction and angles less than 5 degrees on the opposite sides of the angular range around the [1,0,0] direction taken as an axis or within another range crystallographically equivalent to the range, and then, a GaN layer is grown on the surface.

In the present invention; preferably (a) the inclination angle of the surface of the GaAs substrate is equal to or larger than 8 degrees but equal to or smaller than 18 degrees with respect to the GaAs(100) face, and the inclination direction of the surface is within a range of less than 5 degrees on the opposite sides of the [0,−1,1] direction; or (b)

the inclination direction of the surface is equal to or larger than 3 degrees but equal to or smaller than 7 degrees with respect to the GaAs(100) face, and the inclination direction of the surface is within a range of less than 5 degrees on the opposite sides of the [0,1,0] direction around the [1,0,0] direction taken as an axis. Where the inclination direction of the surface is within a range of less than 5 degrees on the opposite sides of the [0,-1,0] direction, further preferably the inclination angle of the surface is equal to or larger than 10 degrees but equal to or smaller than 16 degrees with respect to the GaAs(100) face. It is to be noted that the [0,1,0] direction of GaAs is crystallographically equivalent to the [0,-1,0] direction of GaAs.

In the crystal growth method of the present invention, for example, a hydride vapor deposition method is employed preferably as a method of growing a GaN layer on the surface of a GaAs substrate.

The above and other objects, features, and advantages of the present invention will become apparent from the following description based on the accompanying drawings which illustrate examples of a preferred embodiment of the present invention.

DESCRIPTION OF THE PREFERRED EMBODIMENT

Figure 4:
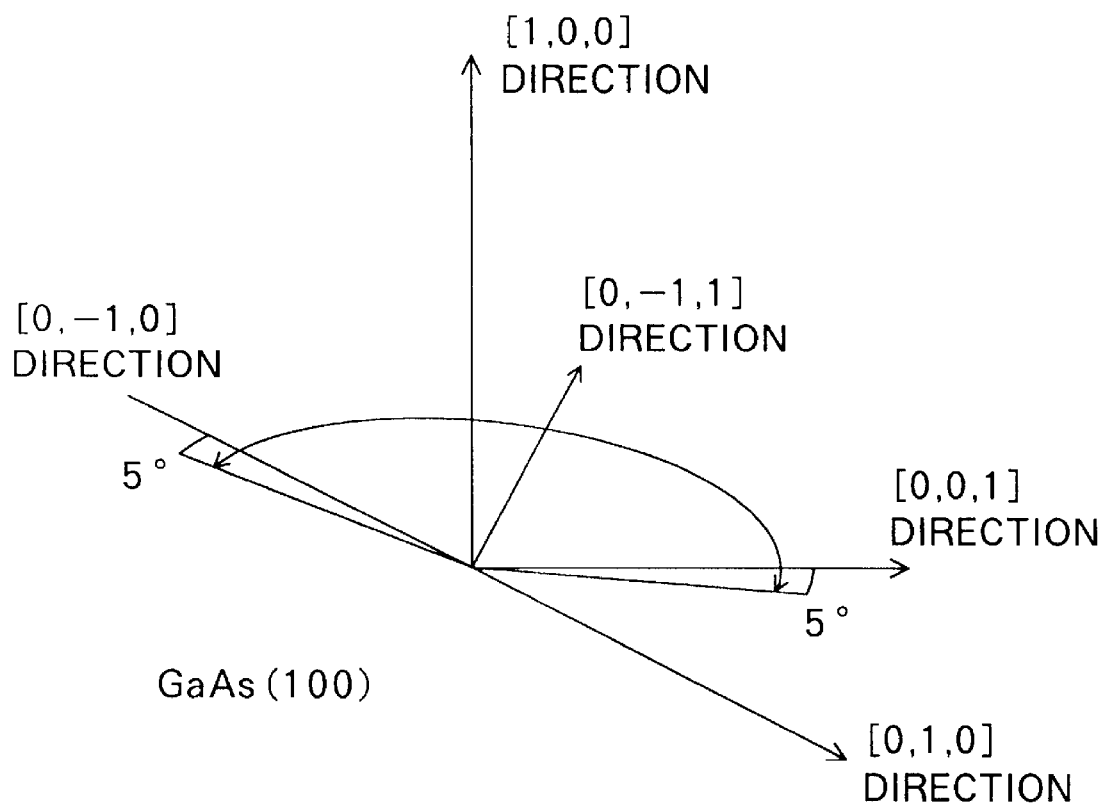
FIG. 4 is a diagrammatic view illustrating a plane azimuth of the surface of a GaAs substrate employed in a preferred embodiment of the present invention.

A crystal growth method of a preferred embodiment of the present invention is characterized by a plane azimuth of the surface of a gallium arsenide (GaAs) substrate for use with crystal growth of a gallium nitride (GaN) film. FIG. 4 illustrates the plane azimuth of the surface of a GaAs substrate employed in the present embodiment.

In the present embodiment, upon crystal growth of a GaN film, a crystalline GaAs substrate having a surface inclined with respect to the GaAs(100) face is used, and the GaN film is formed on the surface of this GaAs substrate. The inclination angle of the substrate surface is larger than 0 degree but smaller than 35 degrees with respect to the GaAs(100) face. Further, the inclination direction of the substrate surface is either within an angular range from the [0,0,1] direction of a GaAs crystal to the [0,-1,0] direction past the [0,-1,1] direction or within another angular range crystallographically equivalent to this angular range. Further, the inclination direction may be, in addition to the angular range just mentioned, within an allowable range of 5 degrees on the opposite sides of the angular range around the [1,0,0] direction taken as an axis. A range indicated by a double-sided arrow mark in FIG. 4 and ranges crystallographically equivalent to this range are angular ranges of the inclination direction of the surface of the GaAs substrate with respect to the GaAs(100).

Figure 5:
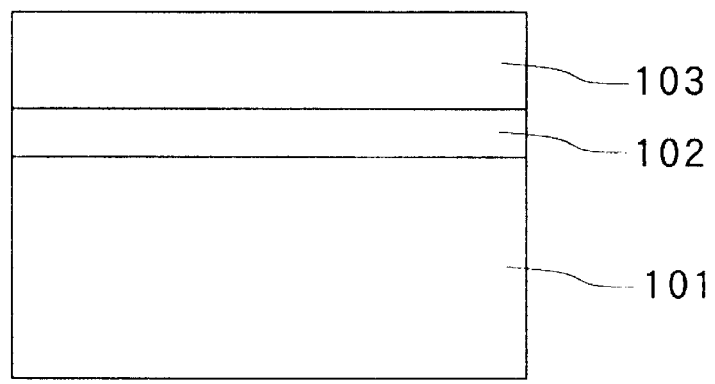
FIG. 5 is a schematic sectional view showing a GaN film grown on a GaAs substrate of the plane azimuth shown in FIG. 4.

In the crystal growth method of the present embodiment, a GaNg film is formed by a hydride vapor deposition method on the surface of a GaAs substrate 101 whose surface plane azimuth is determined in such a manner as described above. FIG. 5 is a sectional view showing the GaAs substrate on which the GaN film is grown in this manner. A GaN low temperature growth buffer layer 102 is formed thin by crystal growth at a relatively low temperature on the GaAs substrate 101, and a GaN high temperature growth layer 103 is formed thick by crystal growth at a relatively high temperature on the GaN low temperature growth buffer layer 102. Here, the GaN low temperature growth buffer layer 102 is employed in order to absorb a distortion which may arise from a difference in lattice constants between GaAs and GaN.

In the following, the present invention is described in more detail in connection with examples and comparative examples.

EXAMPLE 1

For the GaAs substrate 101, a GaAs substrate having, as the surface thereof, a face inclined by 10 degrees toward the [0,1,-1] direction with respect to the GaAs(100) face was used. The GaAs substrate 101 is doped with chromium oxide (CrO) in a concentration of 0.33 weight ppm. Then, an undoped GaN low temperature growth buffer layer 102 and an undoped GaN high temperature growth layer 103 were successively formed on the GaAs substrate 101 by crystal growth based on a hydride vapor deposition method. The growth conditions were as follows. First, the GaN low temperature growth buffer layer 102 was formed for 30 minutes at a substrate temperature of 485° C., and then, the substrate temperature was raised to 700° C. and the GaN high temperature growth layer 103 was formed for 30 minutes.

Figure 1:
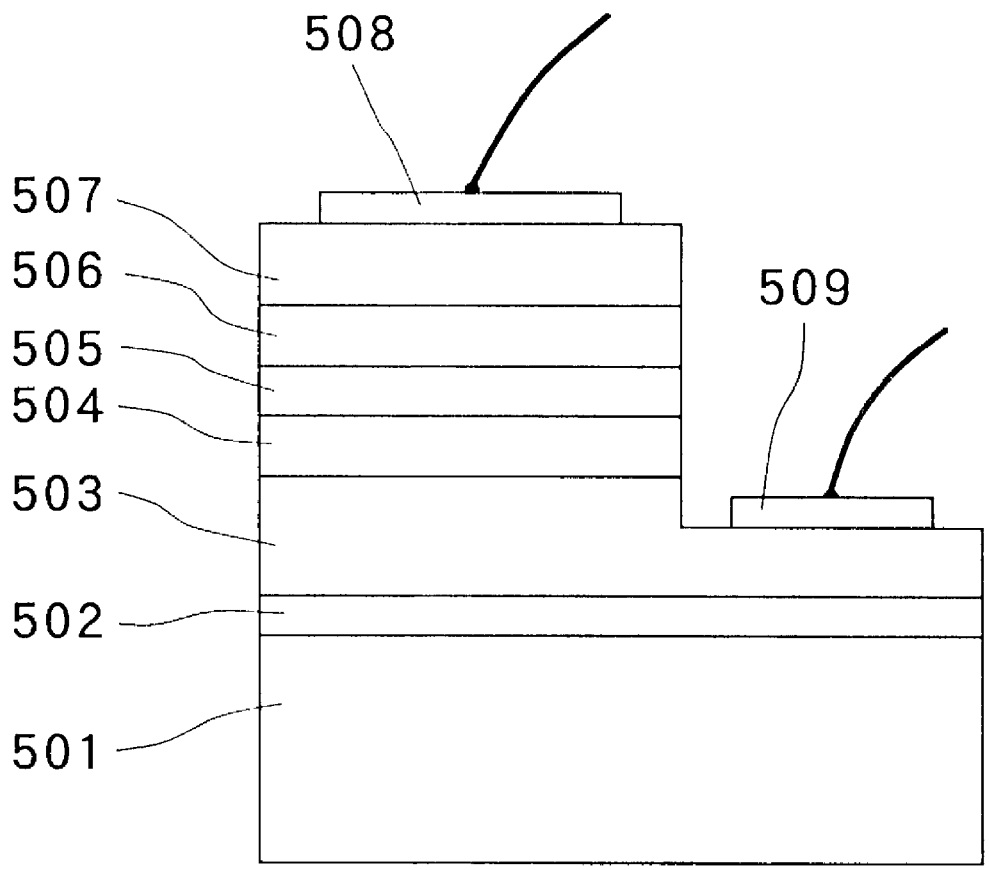
FIG. 1 is a sectional view showing a structure of a light emitting diode (LED) including a gallium nitride (GaN) film formed on a sapphire substrate.
Figure 2:
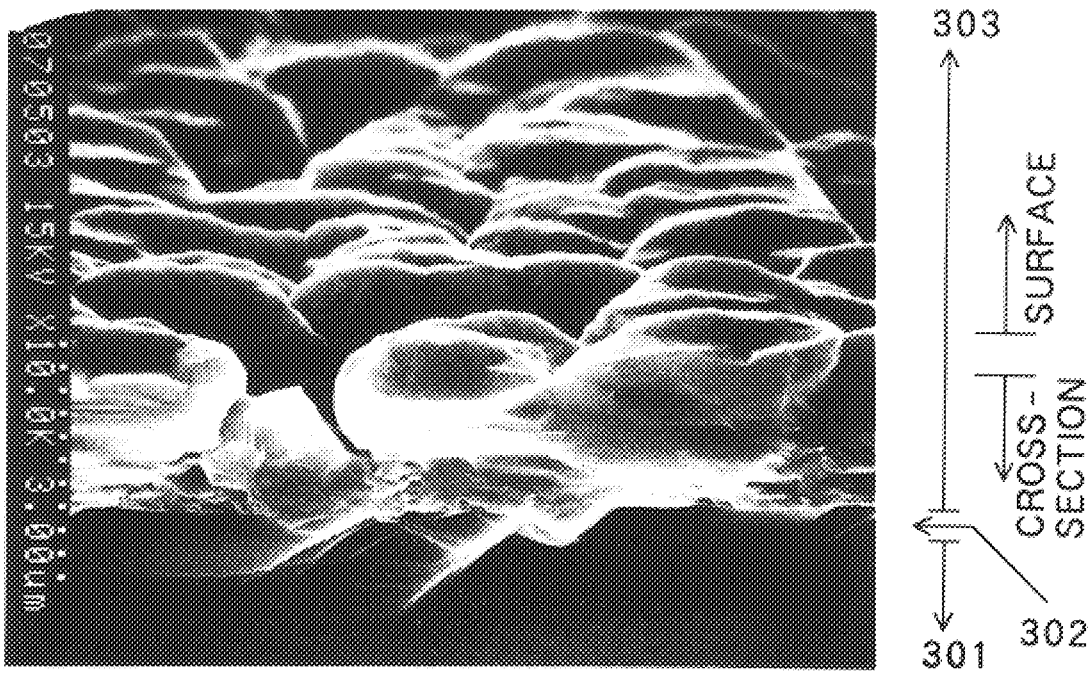
FIG. 2 is a scanning electron microscope (SEM) photograph showing a cross section and the surface of a GaN film formed by a conventional technique on a gallium arsenic (GaAs) (100) substrate.
Figure 3:
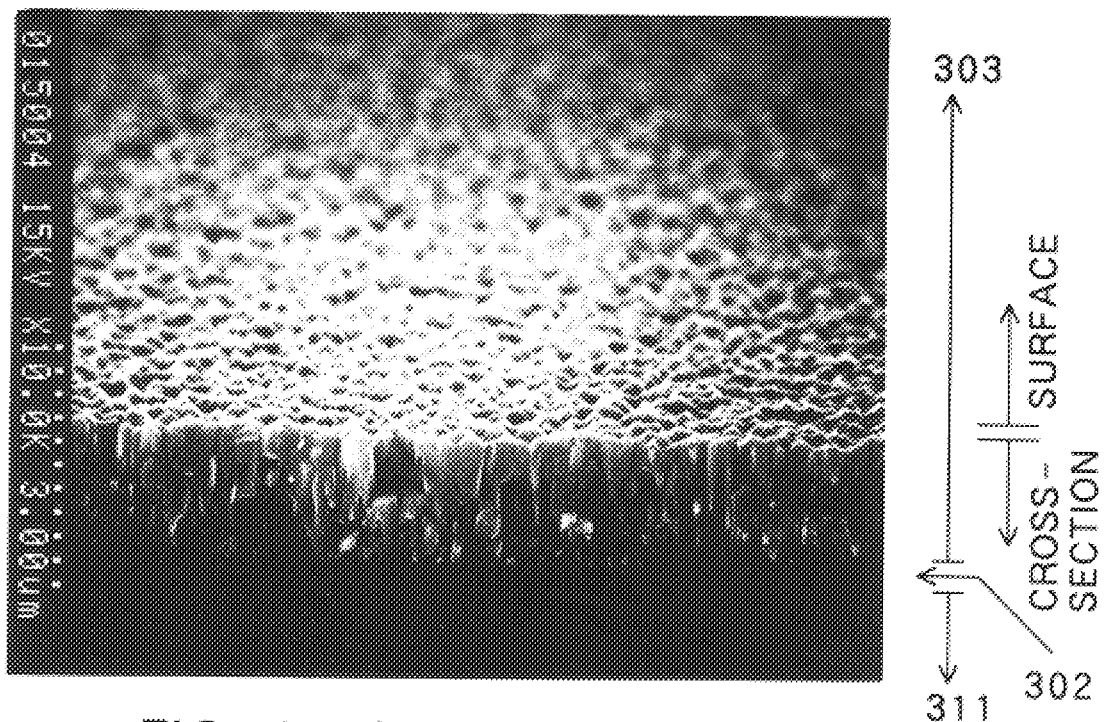
FIG. 3 is a SEM photograph showing a cross section and a surface of a GaN film formed by a conventional technique on a GaAs(111)B substrate.
Figure 6:
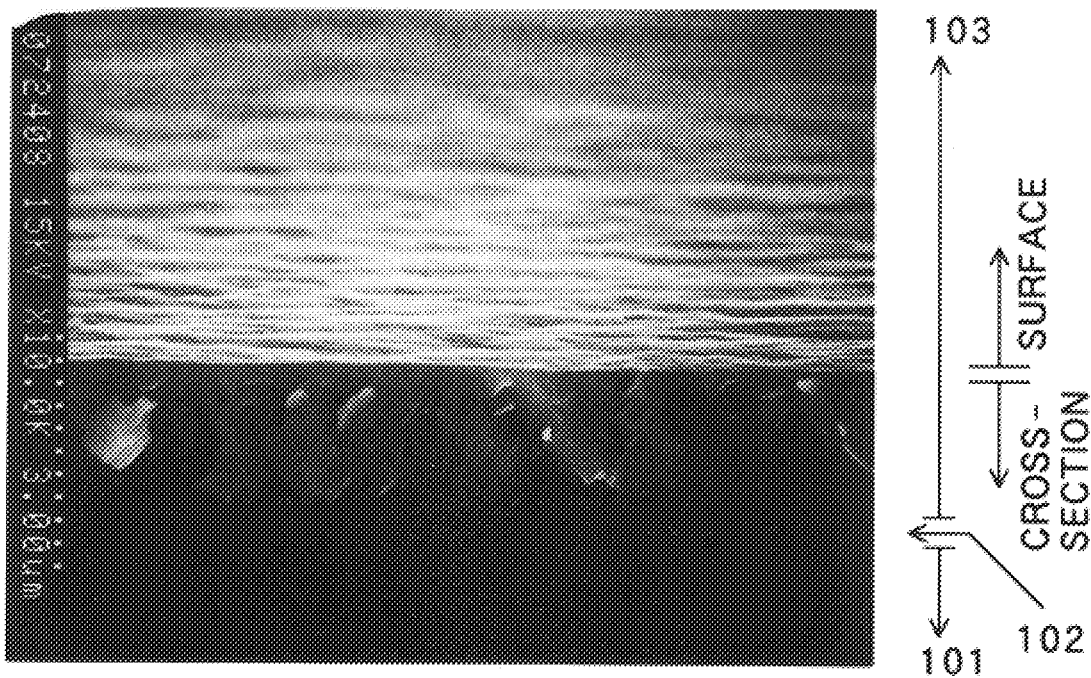
FIG. 6 is a SEM photograph showing a cross section and the surface of a GaN film formed on a GaAs substrate with a surface inclined by 10 degrees toward the [0,1,-1] direction with respect to the GaAs(100) face in an example 1.

FIG. 6 is a scanning electron microscope (SEM) photograph showing a cross section and the surface of the GaN film formed in this manner. As can be seen from FIG. 6, the GaN film according to the example 1 is superior in surface flatness to the GaN films formed by the conventional methods shown in FIGS. 2 and 3. Further, no columnar growth was observed on the GaN high temperature growth layer 103, and it can be seen that a GaN film superior in crystallinity was formed.

EXAMPLE 2

For the GaAs substrate 101, a GaAs substrate having, as the surface thereof, a face inclined by 15.8 degrees toward the [0,1,-1] direction with respect to the GaAs(100) face was used. The GaAs substrate 101 is doped with CrO in a concentration of 0.33 weight ppm. Then, an undoped GaN low temperature growth buffer layer 102 and an undoped GaN high temperature growth layer 103 were successively formed on the GaAs substrate 101 by crystal growth based on a hydride vapor deposition method. The growth conditions were same as those in the example 1.

Figure 7:
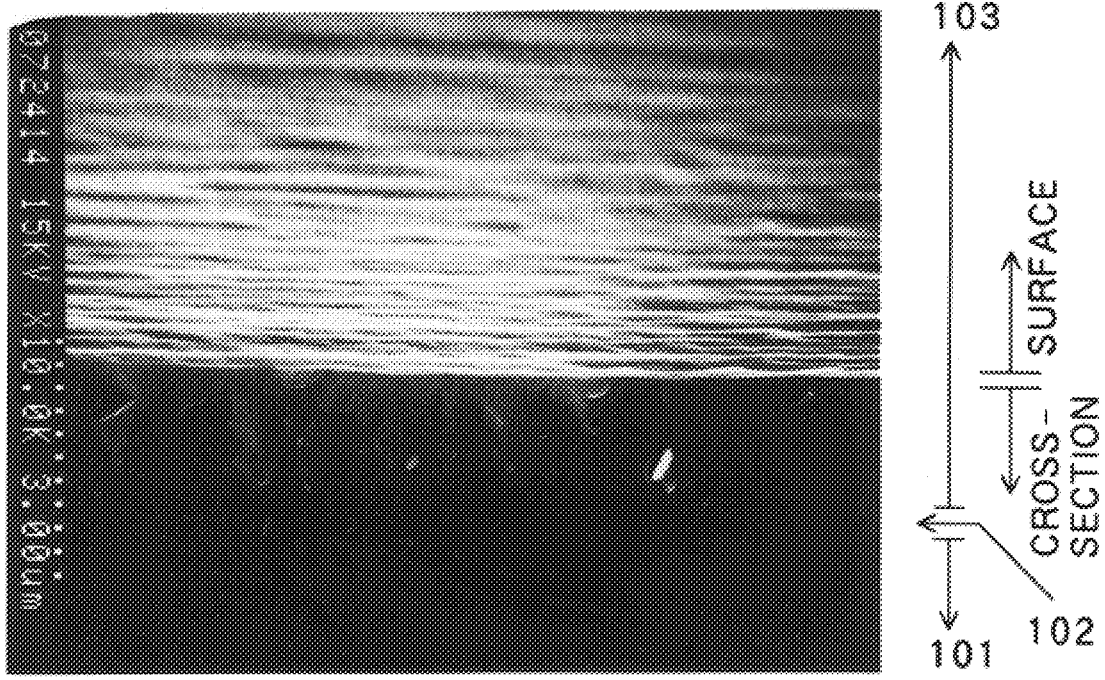
FIG. 7 is a SEM photograph showing a cross section and the surface of a GaN film formed on a GaAs substrate with a surface inclined by 15.8 degrees toward the [0,1,-1] direction with respect to the GaAs(100) face in an example 2.

FIG. 7 is a SEM photograph showing a cross section and the surface of the GaN film formed in this manner. As can be seen from FIG. 7, the GaN film according to the example 2 is superior in surface flatness to the GaN films formed by the conventional methods shown in FIGS. 2 and 3. Further, no columnar growth was observed on the GaN high temperature growth layer 103, and it can be seen that a GaN film superior in crystallinity was formed.

EXAMPLE 3

For the GaAs substrate 101, a GaAs substrate having, as the surface thereof, a face inclined by 5 degrees toward the [0,1,0] direction with respect to the GaAs(100) face was used. The GaAs substrate 101 is doped with CrO in a concentration of 0.33 weight ppm. Then, an undoped GaN low temperature growth buffer layer 102 and an undoped GaN high temperature growth layer 103 were successively formed on the GaAs substrate 101 by crystal growth based on a hydride vapor deposition method. The growth conditions were same as those in the example 1.

Figure 8:
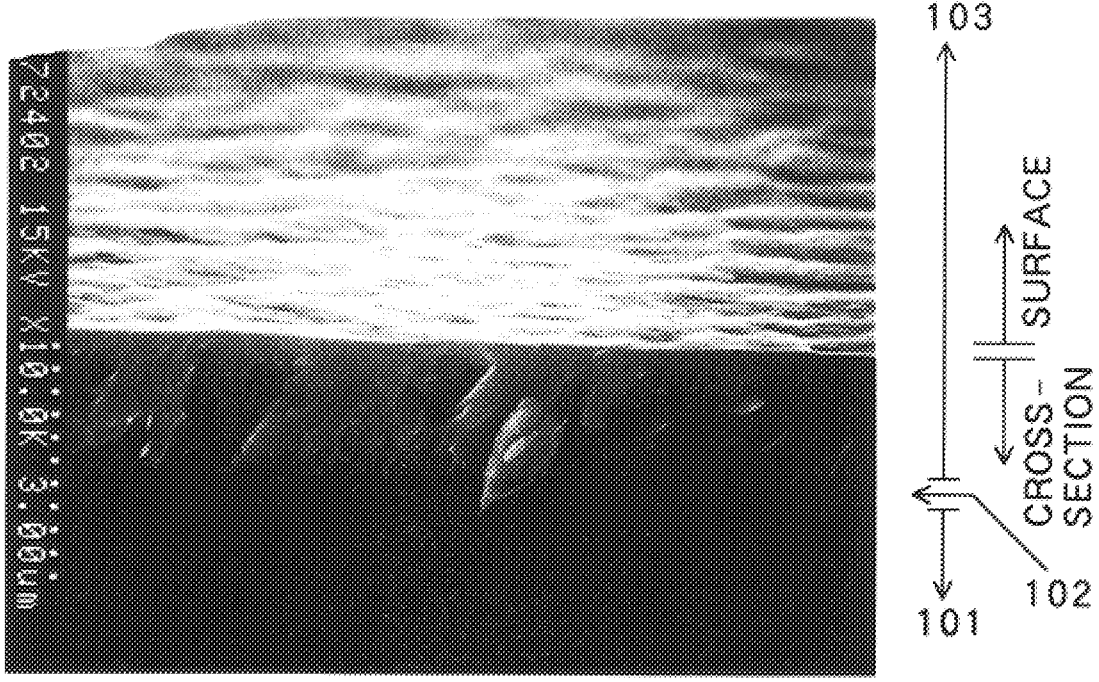
FIG. 8 is a SEM photograph showing a cross section and the surface of a GaN film formed on a GaAs substrate with a surface inclined by 5 degrees toward the [0,1,0] direction with respect to the GaAs(100) face in an example 3.

FIG. 8 is a SEM photograph showing a cross section and the surface of the GaN film formed in this manner. As can be seen from FIG. 8, the GaN film according to the example 3 is superior in surface flatness to the GaN films formed by the conventional methods shown in FIGS. 2 and 3. Further, no columnar growth was observed on the GaN high temperature growth layer 103, and it can be seen that a GaN film superior in crystallinity was formed.

COMPARATIVE EXAMPLE 1

For a GaAs substrate 110 (FIG. 9), a GaAs substrate having, as the surface thereof, a face inclined by 2 degrees toward the [0,1,1] direction with respect to the GaAs(100) face was used. This inclination direction is not included in the range of the inclination direction of a substrate surface according to the present invention. The GaAs substrate 110 is doped with CrO in a concentration of 0.33 weight ppm. Then, an undoped GaN low temperature growth buffer layer 102 and an undoped GaN high temperature growth layer 103 were successively formed on the GaAs substrate 110 by crystal growth based on a hydride vapor deposition method. The growth conditions were same as those in the example 1.

Figure 9:
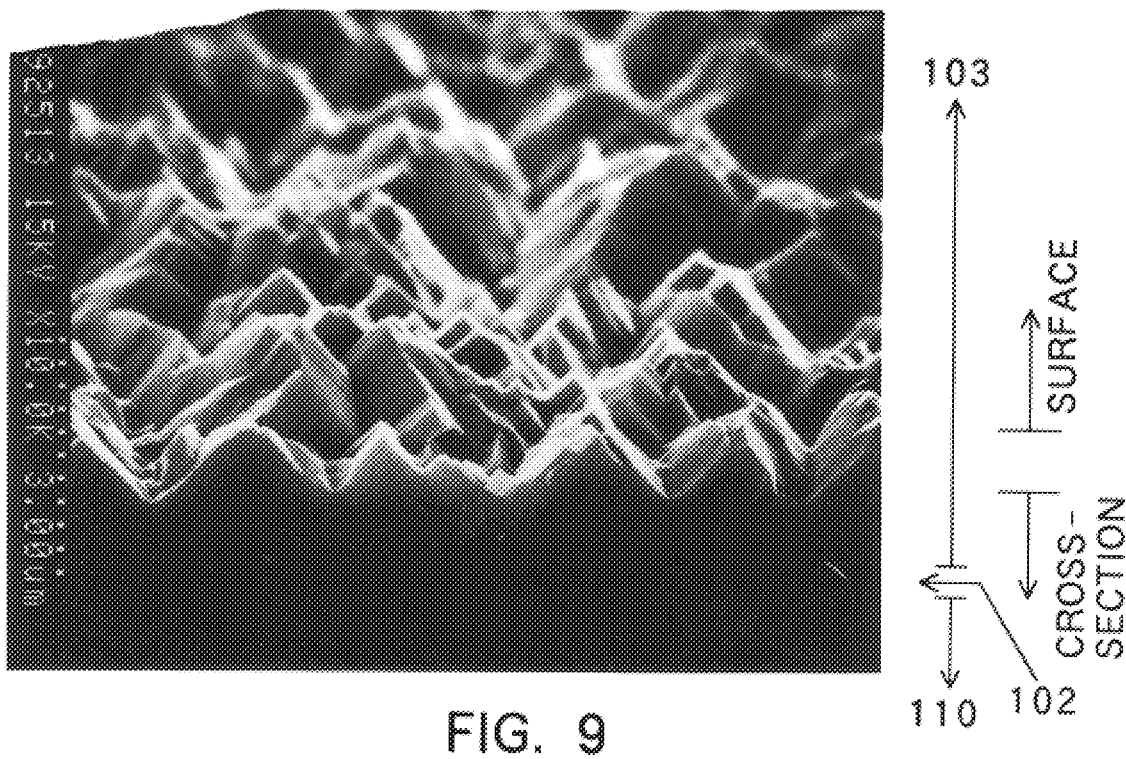
FIG. 9 is a SEM photograph showing a cross section and the surface of a GaN film formed on a GaAs substrate with a surface inclined by 2 degrees toward the [0,1,1] direction with respect to the GaAs(100) face in a comparative example 1.

FIG. 9 is a SEM photograph showing a cross section and the surface of the GaN film formed in this manner. As can be seen from FIG. 9, the GaN film according to the comparative example 1 is very inferior in surface flatness.

EXAMPLE 4

For the GaAs substrate 101, a GaAs substrate whose (311)B face is used as the surface thereof was used. The GaAs(311)B face is one of principal crystal faces of GaAs and is inclined by approximately 25 degrees toward the [0,1,1] direction with respect to the GaAs(100) face. The GaAs substrate 101 is doped with CrO in a concentration of 0.33 weight ppm. Then, an undoped GaN low temperature growth buffer layer 102 and an undoped GaN high temperature growth layer 103 were successively formed on the GaAs substrate 101 by crystal growth based on a hydride vapor deposition method. The growth conditions were same as those in the example 1.

Figure 10:
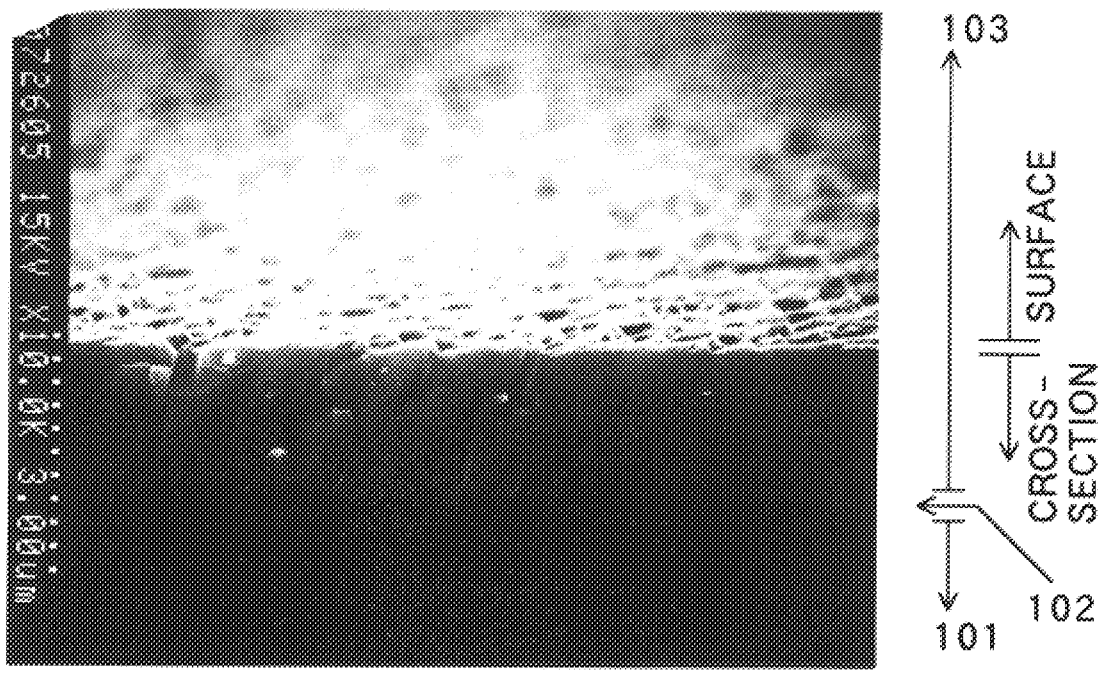
FIG. 10 is a SEM photograph showing a cross section and the surface of a GaN film formed on a GaAs(311)B substrate in an example 4.

FIG. 10 is a SEM photograph showing a cross section and the surface of the GaN film formed in this manner. As can be seen from FIG. 10, the GaN film according to the example 4 is superior in surface flatness to the GaN films according to the conventional methods shown in FIGS. 2 and 3 although the degree of superiority is not so high as those of the example 1, 2 or 3. Further, no columnar growth was observed on the GaN high temperature growth layer 103, and it can be seen that a GaN film superior in crystallinity was formed.

COMPARATIVE EXAMPLE 2

For a GaAs substrate 110 (FIG. 11), a GaAs substrate whose (211)B face is used as the surface thereof was used. The GaAs(211)B face is one of principal crystal faces of GaAs and is inclined by approximately 35 degrees toward the [0,1,-1] direction with respect to the GaAs(100) face. This inclination direction is not included in the range of the inclination direction of a substrate according to the present invention. The GaAs substrate 110 is doped with CrO in a concentration of 0.33 weight ppm. Then, an undoped GaN low temperature growth buffer layer 102 and an undoped GaN high temperature growth layer 103 were successively formed on the GaAs substrate 110 by crystal growth based on a hydride vapor deposition method. The growth conditions were same as those in the example 1.

Figure 11:
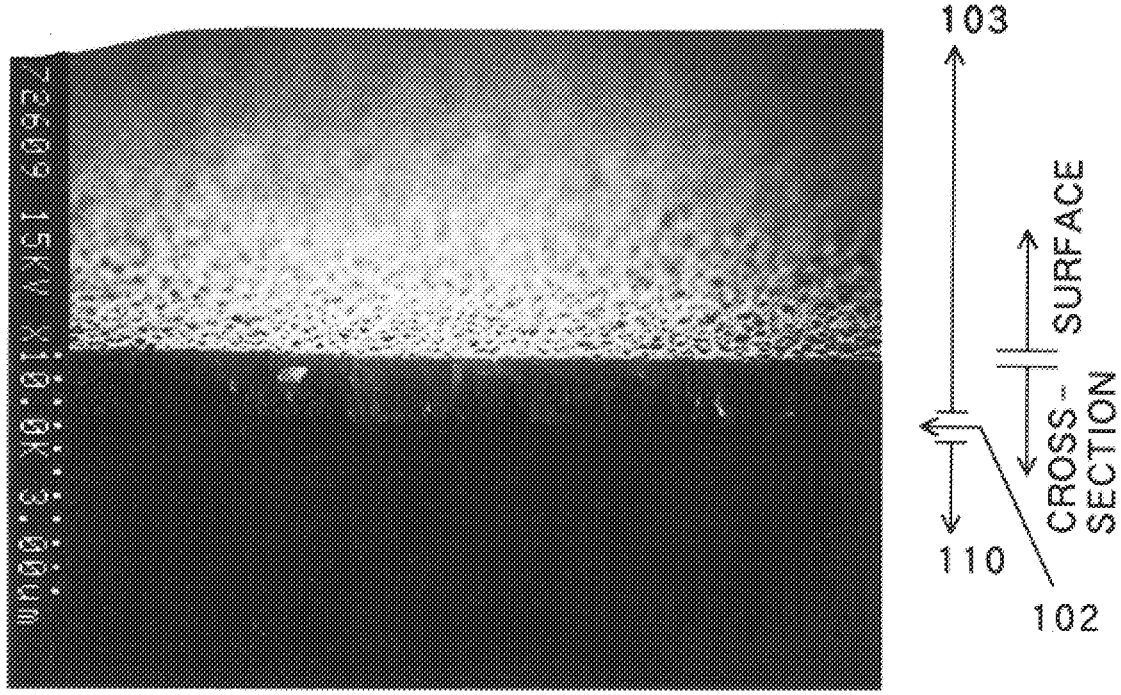
FIG. 11 is a SEM photograph showing a cross section and the surface of a GaN film formed on a GaAs (211)B substrate in a comparative example 2.

FIG. 11 is a SEM photograph showing a cross section and the surface of the GaN film formed in this manner. As can be seen from FIG. 11, the GaN film according to the comparative example 2 has a more flat surface than that of the comparative example 1, but the GaN film has a disadvantage in that columnar growth is observed on the GaN high temperature growth layer 103 and the GaN film is inferior in crystallinity.

From the examples and the comparative examples described above as well as the results shown in FIGS. 2 and 3, it can be seen that a GaN film having a flat surface and superior in crystallinity is formed if, as a GaAs substrate on which a GaN film is to be formed by crystal growth, a GaAs substrate having a surface inclined with respect to the GaAs(100) face is used and the inclination angle of the substrate surface is larger than 0 degree but smaller than 35 degrees with respect to the GaAs(100) face while the inclination direction of the substrate surface is within a range from the [0,0,1] direction to the [0,-1,0] direction past the [0,-1,1] direction or within a range, in addition to the range, of 5 degrees on the opposite sides of the range around the [1,0,0] direction taken as an axis.

Further, as can be seen from the results of the examples 1 and 2, where, in the present invention, a GaAs substrate wherein the inclination angle of the substrate surface from the GaAs(100) face is equal to or larger than 8 degrees but equal to or lower than 18 degrees (most preferably, equal to or larger than 10 degrees but equal to or smaller than 16 degrees) and the inclination direction is [0,1,-1] is used, a GaN film which is particularly good in surface homology and superior in crystallinity can be formed. Similarly, as can be seen from the result of the example 3, also where a GaAs substrate wherein the inclination angle of the substrate surface from the GaAs(100) face is equal to or larger than 3 degrees but equal to or smaller than 7 degrees and the inclination direction is [0,1,0] is used, a GaN film which is particularly good in surface homology and superior in crystallinity can be formed.

According to the present invention, by defining the plane azimuth of the surface of a GaAs substrate which is used to crystal grow a GaN film thereon, a crystalline GaN film which is good in flatness of the surface thereof and superior in crystallinity can be formed on a GaAs substrate which has conductivity and allows cleavage. Further, process techniques which have been developed by crystal growth of other compound semiconductors on GaAs substrates in the past can be utilized, and production of devices can be performed sufficiently making the most of advantages of a GaAs substrate.

It is to be noted that the layer construction of a GaN film in the present invention is not limited to those of the examples described above, and also a GaN film of an arbitrary layer construction which is formed on a GaAs substrate defined in the appended claims shall be included in the spirit and scope of the present invention.

What is claimed is:

1. A crystal growth method for forming a gallium nitride (GaN) film on a gallium arsenide (GaAs) substrate, comprising the steps of;

providing a gallium arsenide substrate having a surface which is inclined with respect to a GaAs(100) face, an inclination angle of the surface being larger than 0 degree but smaller than 35 degrees with respect to the GaAs(100) face, and an inclination direction of the surface being within a range of an angular range from a [0,0,1] direction of gallium arsenide to a [0,-1,0] direction of gallium arsenide past a [0,-1,1] direction of gallium arsenide and angles less than 5 degrees on opposite sides of the angular range around an [1,0,0] direction of gallium arsenide taken as an axis, or within another range crystallographically equivalent to the range; and growing a gallium nitride layer on the surface.

2. The crystal growth method according to claim 1, wherein the gallium nitride layer is grown on the surface by a hydride vapor deposition method.

3. The crystal growth method according to claim 1, wherein the inclination direction of the surface is within an angular range from the [0,0,1] direction to the [0,-1,0] direction past the [0,-1,1] direction or within a range crystallographically equivalent to the angular range.

4. The crystal growth method according to claim 1, wherein the inclination angle of the surface is equal to or larger than 8 degrees but equal to or smaller than 18 degrees with respect to the GaAs(100) face, and the inclination direction of the surface is within a range of less that 5 degrees on opposite sides of the [0,-1,1] direction.

5. The crystal growth method according to claim 4, wherein the gallium nitride layer is formed on the surface by a hydride vapor deposition method.

6. The crystal growth method according to claim 4, wherein the inclination angle of the surface is equal to or larger than 10 degrees but equal to or smaller than 16 degrees with respect to the GaAs(100) face.

7. The crystal growth method according to claim 1, wherein the inclination direction of the surface is equal to or larger than 3 degrees but equal to or smaller than 7 degrees with respect to the GaAs(100) face and the inclination direction of the surface is within a range of less than 5 degrees on opposite sides of a [0,1,0] direction of gallium arsenide around the [1,0,0] direction taken as an axis.

8. The crystal growth method according to claim 7, wherein the gallium nitride layer is grown on the surface by a hydride vapor deposition method.

9. The crystal growth method according to claim 1, wherein the gallium arsenide substrate is doped with chromium oxide (CrO).

* * * * *

UNITED STATES PATENT AND TRADEMARK OFFICE
CERTIFICATE OF CORRECTION

PATENT NO. : 5,843,227
DATED : December 1, 1998
INVENTOR(S) : Akitaka KIMURA, Haruo SUNAKAWA, Masaaki NIDO and Atsushi GUCHI It is certified that error appears in the above-identified patent and that said Letters Patent is hereby corrected as shown below:

Column 2, line 6, insert --GaN-- before film.

Signed and Sealed this

First Day of June, 1999

Attest:

Q. TODD DICKINSON

Attesting Officer

Acting Commissioner of Patents and Trademarks